United States Patent [19]

Chambers

[11] Patent Number: 4,672,169

[45] Date of Patent: Jun. 9, 1987

[54] APPARATUS AND METHOD FOR HEATING MATERIALS WITH A LASER HEAT SOURCE

[75] Inventor: Frank A. Chambers, West Chicago, Ill.

[73] Assignee: Standard Oil Company (Indiana), Chicago, Ill.

[21] Appl. No.: 714,330

[22] Filed: Mar. 21, 1985

[51] Int. Cl.⁴ ............................................. B23K 26/00
[52] U.S. Cl. ................................. 219/121 L; 219/349;
219/121 LP; 219/121 LQ; 219/121 FS;
219/121 LM
[58] Field of Search ..... 219/121 L, 121 LM, 121 LE,
219/121 LF, 121 LP, 121 LQ, 121 LR, 121 FS,
349, 347; 350/299, 293, 292, 294, 288

[56] References Cited

U.S. PATENT DOCUMENTS

| 3,427,435 | 2/1969 | Webb | 219/349 |
| 3,817,710 | 6/1974 | Mizutani et al. | 219/349 |
| 4,058,699 | 11/1977 | Van Bloten | 219/121 LP |
| 4,188,519 | 2/1980 | Berg | 219/349 |
| 4,547,650 | 10/1985 | Arditty et al. | 219/121 LQ |

FOREIGN PATENT DOCUMENTS 0215288  12/1983  Japan ............................ 219/121 LQ Primary Examiner—M. H. Paschall
Attorney, Agent, or Firm—Anthony J. Janiuk; William H. Magidson; Ralph C. Medhurst

[57]  ABSTRACT

An apparatus and method for heating materials with photoelectric radiant energy include directing photoelectric radiant energy onto a reflective conical member positioned at one focal line of an ellipsoidal reflective surface. The radiant energy is dispersed by the conical member and directed to the reflective wall. Radiant energy is further reflected by the ellipsoidal surface to an opposite focal line creating an area of intense radiant energy. Materials to be heated are introduced into the area of intense photoelectric radiant energy. Embodiments of the present invention are applicable to reacting silane and ammonia to form silicon nitride by laser pyrolysis.

5 Claims, 6 Drawing Figures

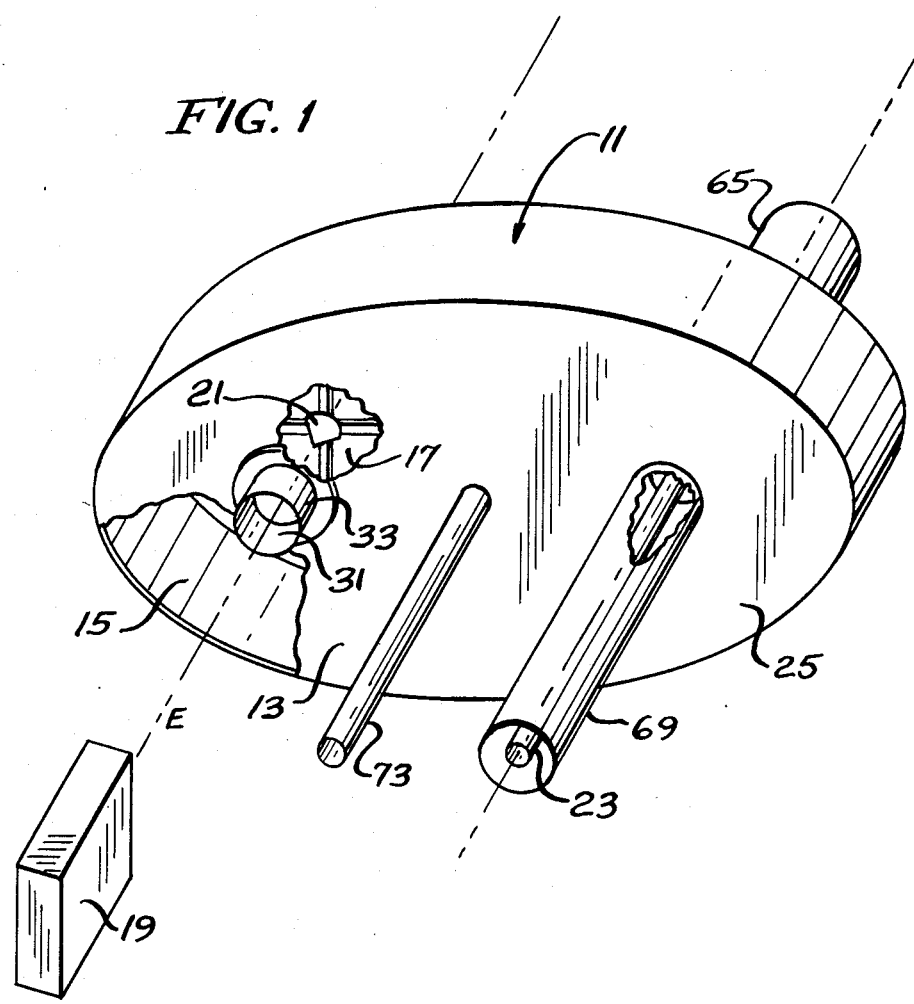
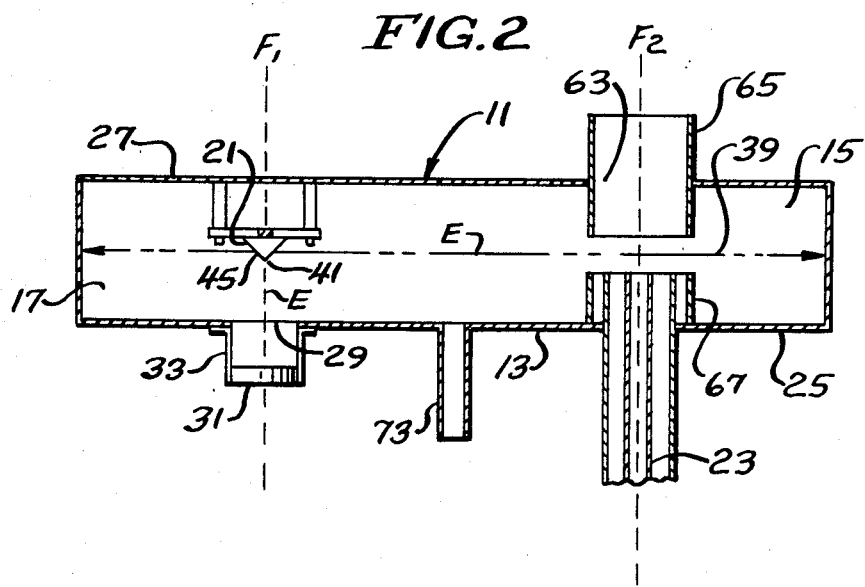

APPARATUS AND METHOD FOR HEATING MATERIALS WITH A LASER HEAT SOURCE

BACKGROUND OF THE INVENTION

The present invention pertains to methods and apparatus for heating materials with photoelectric radiant energy. In particular, the present invention pertains to an apparatus and method for pyrolyzing silane ($SiH_4$) and ammonia ($NH_3$) gases to form silicon (Si) and silicon nitride ($Si_3N_4$) powders.

Considerable attention has been directed to silicon nitride due to its intrinsic properties of low thermal expansion and moderate elastic modulus, and ability to withstand thermal shock. Silicon nitrides have potential structural applications as high-temperature ceramics. However, the same physical properties which make silicon nitride an attractive high-temperature ceramic material create difficulty in fabricating silicon nitride into dense and suitable shapes.

Most commercially available silicon nitride powder is produced by nitriding silicon. The process includes nitriding loose silicon powder in a nitrogen atmosphere for long periods at temperatures between 1,200° C. and 1,350° C. The prolonged period of heating is followed by a shorter period of heating at still higher temperatures above the melting temperature of silicon. Temperature control is important in the process yet temperature is difficult to control due to the exothermic nature of the reaction. A solid cake of silicon nitride is formed which must be reduced to a powder by pulverizing and milling. The silicon nitride powder formed by pulverizing and milling is nonuniform in particle size and shape. Pulverizing and milling may also introduce further contaminants into the silicon nitride powder.

Two general methods for forming shaped silicon nitride articles of manufacture include hot pressing and pressureless sintering. In the method known as hot pressing, a silicon nitride powder is hot pressed with 1–5% by weight of yttrium oxide ($Y_2O_3$) at 4,000 pounds per square inch (psi) and temperatures between 1,700° C. and 1,800° C. Hot pressing is usually carried out in graphite dies which are coated with nitride slurries to prevent reactions with the graphite and to ease material removal. Hot pressing results in fully dense silicon nitride materials, but is limited to fairly simple shapes and is very expensive.

Pressureless sintering techniques are also used to densify silicon nitride. In typical pressureless sintering processes, powder shapes are prepared by conventional methods such as injection molding allowing shapes of greater complexity. The silicon nitride mold is then subjected to temperatures of 1,400° C. under a nitrogen atmosphere. Pressureless sintering techniques do not result in fully dense silicon nitride materials.

Both hot pressing and pressureless sintering techniques require silicon nitride powders of uniform composition and purity. Such powders of uniform size and purity are not normally obtained under current commercially available processes. Despite recent improvements in processing silicon carbide and silicon nitride powders produced by heated vapor and arc plasma techniques, it has not been possible to densify silicon carbide and silicon nitride to theoretical densities without the use of pressure or additives.

In a recent article, S. C. Danforth, J. H. Flint, W. R. Cannon and J. S. Haggerty report that silicon and silicon nitride powders can be pyrolyzed from silane and ammonia/silane gas mixtures by direct coupling initiated by thermal energy provided by a $CO_2$ laser heat source. The powders produced from silane with the use of the laser heat source are characterized by a grain size less than 0.1 micrometer, a narrow size range, little agglomeration, spherical shapes, and high chemical and phase purity. In the process described, a laser beam enters a housing through a potassium chloride window and is arrested by a water cooled copper block. The silicon nitride powders were synthesized by introducing reactant gases orthogonally into a laser beam. Power densities for the laser apparatus were in the range of 250 to 760 watts/$cm^2$ for an unfocused 0.5-centimeter diameter beam. Reactant gases were injected into the laser beam through a 1-millimeter inside diameter stainless steel inlet tube. An inert gas introduced into the reaction vessel coaxially with the reactant gases minimized reaction gas expansion and directed product powders out of the reaction vessel. Cell pressures were maintained in the range of 0.1 to 0.5 atmosphere. Approximately 600 centimeters per minute argon gas was maintained falling past the laser window to keep the window clear. A 10-to-1 mixture of ammonia to silane was employed with a typical flow rate of 110 cc/min. ammonia to 11 cc/min. silane. See S. C. Danforth, et al, "Laser Synthesis of Silicon Nitride Powders," *American Institute of Physics*, pp. 659 to 663 (1979).

Despite the recent developments in laser synthesis of silicon nitride powders, the experimental techniques of Danforth et al are not acceptable to scaling up to larger quantities. Specifically, the introduction of reactant gases orthogonally into the laser beam results in uneven heating of the gases. Gas molecules in the stream which are in a position close to the laser receive much more radiant energy than gas molecules in a position distal to the laser. Larger gas streams of reactant gases required for commercial production would require an unrealistic increase in the diameter of the laser beam or the addition of more lasers at great cost.

Thus, there is a need for a method and apparatus for the production of silicon nitride powders by laser pyrolysis that is susceptible to commercial use, which will heat a gas stream in a substantially uniform manner.

DESCRIPTION OF THE INVENTION

It is an object of the present invention to provide a method and apparatus for heating materials with photoelectric radiant energy. In particular, embodiments of the present invention provide apparatus and methods for pyrolyzing materials such as silane and ammonia with a laser heat source. Other objects appear hereinafter.

Briefly, an embodiment of the present invention includes an apparatus for heating materials which includes a housing having a reflective inner wall having a substantially closed curved shape defining at least one focal point. The inner wall has a surface reflective to photoelectric radiant energy. The apparatus further includes means for receiving photoelectric radiant energy and dispersing the energy uniformly to the reflective inner wall. The dispersing means can take the form of a prism or reflective surfaces such as a cone. The reflective inner surface reflects the photoelectric radiant energy to a focal point creating an area of intense radiant energy. Materials to be heated are introduced into the area of intense radiant energy. The reflective inner wall can take various shapes such as circles, ellipses, and three-dimensional forms which define a focal point or line. The term "substantially closed curved shape" is used herein to include discreet non-curved surfaces which when viewed as a whole operate as a single curved surface.

A closed curved shape in the form of an ellipse is preferred. An ellipse has two focal points, and an elliptical wall therefore defines two focal lines. Radiant energy emanating from one focal point or line is reflected and concentrated on the opposing focal point or line. An elliptical wall allows the positioning of dispersing means at one focal line such that radiant energy is reflected to the opposite focal line where materials to be heated are introduced.

The dispersing means utilized in practicing the present invention depends on the photoelectric radiant energy. A reflective conical member is preferred with a $CO_2$ laser light source. The shape of the conical member depends upon the shape of the reflective wall and the degree of focusing desired. The outer conical walls of a conical member can be curved to further focus laser emissions. Further, the angle of the conical wall and the reflective inner wall can cooperate to alleviate a shadow effect caused by internal structures including the conical member itself.

Embodiments of the present invention are particularly useful for heating silane and ammonia gases to synthesize silicon nitride powders. However, the present invention also has application in processes to zone melt and refine refractory materials such as tungsten or zirconium, or to recrystallize by zone melting and solidification polycrystalline rod made of a material such as alumina.

One embodiment of the present invention is directed to an apparatus for pyrolyzing silane and ammonia to form silicon nitride powders with a laser heat source. The apparatus includes a housing having an ellipsoidal wall defining an inner cavity area and two focal lines. The ellipsoidal wall has an inner surface reflective to laser emissions. The apparatus includes a potassium chloride window for receiving laser emissions axially about one focal line. Laser emissions received by the potassium chloride window are directed to a conical member which disperses the emissions to the ellipsoidal walls of the housing. Emissions are reflected by the inner surface of the ellipsoidal wall to the opposite focal line forming a wall or plane of intense radiant energy. Silane and ammonia gases are introduced into the housing by means of a reactant conduit positioned axially in line with the focal line of the ellipsoidal wall opposite the conical member. The silane and ammonia gases pass through the wall or plane of intense laser light and are heated to reaction temperatures. A flue is positioned downstream in the path of the silane and ammonia gases to receive the reaction products for removal from the housing.

The laser emissions heat the stream of reactant gases from all sides due to the reflection pattern of the ellipsoidal wall. Moreover, the radiant heating is not limited to the gas molecules at or near the stream surface. As radiant energy passes through the stream of gases from all sides, the energy continues to be distributed in an even concentric manner throughout a cross section of the stream. Laser emissions, which are not initially absorbed or deflected by reactant or product gases, continue to be focused or concentrated radially into the stream until such emissions pass through the focal point or line. Even after the emissions pass through the focal point or line, the emissions are distributed evenly in a radially diverging manner.

Further, the emission profile is initially divided at the focal point or line by the conical member and recombined to provide a sharper emission profile at the opposite focal point or line in the stream of reactant gases. The even and sharp distribution of radiant energy produces silicon nitride powders of small grain size and uniform size, shape and purity with little agglomeration. The even distribution of radiant energy also provides greater yields of product powders and has commercial applications.

An embodiment of the present invention also includes a method applicable for heating materials with photoelectric radiant energy. The method includes directing a beam of photoelectric radiant energy onto a conical member or some other means which disperses the light into a housing having a substantially closed curved wall reflective to the radiant energy. The reflective wall defines at least one focal point to which the radiant energy is focused, creating an area of intense radiant energy. Next, materials to be heated are introduced into the area of intense photoelectric radiant energy.

Embodiments of the present invention are simple in construction and in procedure. Embodiments of the present invention are applicable to refining and recrystallization processes, and in particular processes which require substantially uniform intense local heating from all sides of the material.

Other features and advantages of the present invention will be apparent from the following description which, by way of illustration, shows preferred embodiments of the present invention and the principles thereof and what is now considered to be the best mode to apply these principles.

DESCRIPTION OF THE DRAWINGS

FIG. 1 is elevational view of an apparatus for heating with photoelectric radiant energy;

FIG. 2 is a top sectional view of the apparatus of FIG. 1;

DETAILED DESCRIPTION

Figure 3:
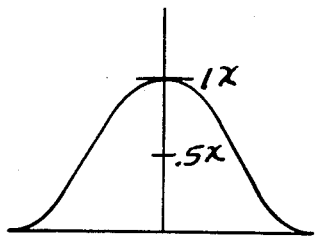
FIG. 3 is a graph describing a beam intensity profile of a $CO_2$ laser.

The present invention is described in detail as a method and apparatus for pyrolyzing silane and ammonia to silicon nitride, with the understanding that the present disclosure is to be considered an exemplification of the principles of the invention and is not intended to limit the invention to the embodiment illustrated. The present invention can be used wherever it is necessary to produce a uniform, intense, local heating on a material. The present invention has application in zone melting and refining any refractory material including, by way of example without limitation, tungsten or zirconium.

Turning now to FIGS. 1 and 2, an apparatus, generally designated by the numeral 11, for pyrolyzing silane and ammonia to silicon nitride with a $CO_2$ laser 19, includes the following major components: a housing 13 having an inner reflective wall 15 within an inner chamber 17, a conical member 21, and reactant conduit 23.

Housing 13 includes inner reflective wall 15, forward wall 25 and back wall 27. Inner reflective wall 15 has a closed curved surface in the shape of an ellipse. Inner reflective wall 15 defines the shape of inner chamber 17 with forward wall 25 and back wall 27. Inner reflective wall 15, by virtue of its elliptical shape, defines two focal lines F1 and F2.

Forward wall 25 includes a port or opening 29 in axial alignment with focal line F1. Potassium chloride window 31 and supporting frame 33 cover and close port 29 but allow the entry of laser emissions (E) from laser 19 into chamber 17 of housing 13 in axial alignment with focal line F1.

Figure 5:
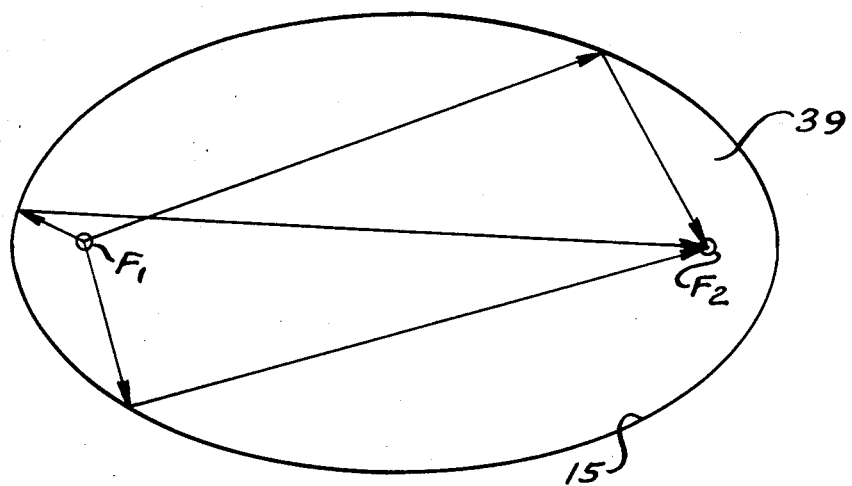
FIG. 5 illustrates a reflection pattern within an ellipsoidal structure.

Conical member 21 includes conical walls 43 and apex 41. Conical member 21 is positioned within chamber 17 of housing 13 with apex 41 on focal line F1 oriented towards the potassium chloride window 31 and laser 19. Conical member 21 receives laser emissions (E) entering housing 13 through potassium chloride window 31 and reflects the emissions to inner reflective wall 15 to create a reflective pattern which can best be seen in FIG. 5. The reflection pattern creates a wall or plane of laser emission 39 which is focused by the geometric shape of reflective wall 15 on a small area on focal line F2.

Figure 6:
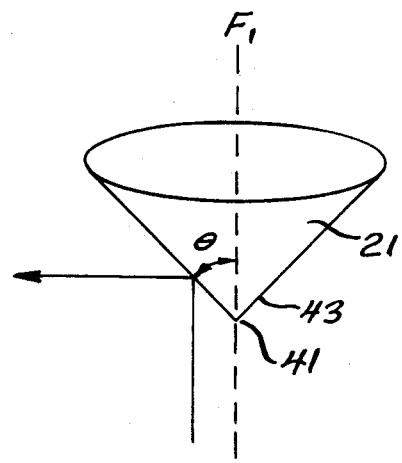
FIG. 6 is a top, slightly rearward view of a conical member.

Turning briefly to FIG. 6, conical member 21 has the shape of a right circular cone. Conical member 21 includes a conical wall 43 oriented at an angle, generally designated as 8 about focal line F1. Angle $\theta$ may be 45° to reflect incident light from laser 35 towards ellipsoidal walls at right angles creating a wall or plane 39 of light of high intensity that will be reflected and focused at opposing focal line F2. However, those skilled in the art may recognize that the conical member 21 itself poses an obstruction within the path of reflected light. It is sometimes advantageous to increase angle $\theta$ to reflect incident light slightly forward at a slight angle such that light does not reflect back to conical member 21 and create a shadow effect at opposing focal line F2.

Returning now to FIGS. 1 and 2, the position of conical member 21 is determined for the most part by the fixed geometry of reflective wall 15 of the housing 13 and normally would not require adjustment. However, conical member 21 can be provided with support frame 49 which allows the conical member to move vertically on bar 51 or horizontally on lateral bar 53. Conical member 21 is also provided with adjustment for depth within chamber 17 by means of axial bars 55 to allow the wall 39 of emissions (E) to be aligned with internal structures in chamber 17.

The dimensions of the conical member 21 normally correspond approximately to the dimensions of the diameter of the laser emission (E) produced by laser 19. A commercially available laser provides a beam of approximately one-quarter of an inch in diameter. To provide adequate clearance for conical member 21 and other internal features, chamber 17 preferably has internal dimensions along the major axis of 8 inches and the minor axis of 4 to 6 inches. Reflective wall 15 can be 2 inches in width. Typical materials for construction include cost-effective reflective materials such as copper or molybdenum. A chamber 17 and reflective wall 15 having larger dimensions relative to the reactant conduit 23 and conical member 21 can minimize shadow effects but can increase material costs for the apparatus. Those skilled in the art can adjust the dimensions of the present apparatus for their individual needs and preferences.

Figure 4:
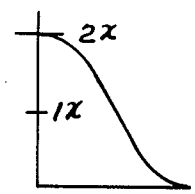
FIG. 4 is an incident beam intensity profile of a $CO_2$ laser beam reflected within the apparatus of FIG. 1 and a second focal line.

Reflective wall 15 collects and focuses light to focal line F2. A light emission from a conventional $CO_2$ laser has an incident beam intensity profile moving orthogonally through the beam as depicted in FIG. 3. The present invention reflects the beam of laser light, doubling the beam back upon itself, to produce an incident beam intensity profile moving axially along focal line F2 as illustrated in FIG. 4. The splitting of the beam at its peak essentially folds the tail of the beam profile onto itself leaving a sharp boundary at the maximum intensity point of the beam. If the total radiant energy of the laser emissions (E) of FIG. 3 and FIG. 4 remain identical, the intensity of the emissions (E) of the reflected beam at F2 shown in FIG. 4 will be twice that of the non-reflected emissions (E) illustrated in FIG. 3. The units of light intensity shown in FIGS. 3 and 4 are arbitrary and intended to show only the relative intensities. The incident beam profile may be further narrowed by inwardly curving conical walls 43 which converge or focus laser emissions (E) as the emissions (E) are directed to reflective wall 15 and to focal line F2.

Reactant conduit 23 feeds a stream of silane and ammonia reactant gases into the housing 13 axially along focal line F2. Reactant conduit 23 terminates before intersecting the plane or wall of reflected laser emission 39 such that reactant gases exiting from conduit 23 intersect the plane of light and are heated from all sides and in an even concentric manner throughout to reaction temperatures.

Returning now to FIG. 5, laser emissions (E) heat the stream of reactant gases from all sides due to the reflection pattern of the ellipsoidal wall 15. Moreover, the radiant heating is not limited to the gas molecules at or near the stream surface. As emissions (E) pass through the stream of gases exiting reaction conduit 23, the emissions (E) continue to be distributed in an even concentric manner throughout the cross section of the stream. Laser emissions (E) which are not initially absorbed or deflected by reactant or product gases, continue to be radially focused or concentrated from all sides into the stream until such emissions (E) pass through the focal line F2. Even after the emissions (E) pass through the focal line F2, the emissions (E) are distributed evenly in a radially diverging manner.

Turning again to FIGS. 1 and 2, silicon nitride powders formed from the reaction exit through a port 63 in back wall 27 of housing 13. Flue 65 projects through port 63 and into the cavity 17 of housing 13 terminating in close proximity to the plane of laser emissions 39 to receive and conduct unreacted gases and product silicon nitride powder clear of apparatus 11 for further processing. A forward flue 67 projects forward from forward wall 25 to collect silicon nitride powders and prevent such powders from depositing upon the reflective surfaces of ellipsoidal wall 15.

An inert gas conduit 69 surrounds reactant conduit 23. Inert gas conduit 69 forces inert gas to flow concentrically around the reactant gases, silane and ammonia, to assist in conducting the product powder through exit flue 65, and to confine reactant gases to an area about focal line F2.

A purging conduit 73, in communication with cavity 17 of the housing 13, allows inert gases to be forced through cavity 17 and out flue 65 to further maintain reflective wall 15 free of silicon nitride powder deposits.

The laser heat source 19, used in conjunction with the present apparatus, is preferably a $CO_2$ laser. The emissions of $CO_2$ lasers characteristically have a highest gain P(18) and P(20) in close spectrographic proximity to absorption bands of silane and ammonia.

In operation, the apparatus defines a method for pyrolyzing refractory materials with photoelectric radiant energy. As the method is applied to the production of silicon nitride powder, a $CO_2$ laser emission (E) is directed into chamber 17 of housing 13 having an ellipsoidal inner reflective wall 15 which defines focal lines F1 and F2. The laser emission (E) is directed along one focal line F1 through a potassium chloride window 31 and onto conical member 21 which directs the laser emission (E) onto the reflective wall 15. The ellipsoidal wall 15 redirects and focuses the laser emission to opposing focal line F2 creating an area of intense laser energy. Materials to be heated, such as silane and ammonia gases, are introduced along focal line F2 by means of reactant conduit 23. The reactant gases pass through a wall or plane of intense laser-emitted light 39 at focal line F2 where such gases are heated to reaction temperatures to form silicon nitride powder. Powders formed about focal line F2 are carried through flue 65 for further processing by inert gases flowing concentrically around reactant gases by means of an inert gas conduit 69.

In the pyrolysis of silane and ammonia to form silicon nitride powders, a reactant gas composition of ammonia to silane in a 10-to-1 ratio is preferred. Normally, the reactant gases are recycled upon the removal of product silicon nitride powders. Flow rates are adjusted to carry product powders through flue 65 and provide adequate dwell time. The laser pyrolysis of silane and ammonia to form silicon nitride avoids the need for temperature controls within the reaction area.

The present invention provides uniform heating of a stream of reactant gases to form a more uniform product. Further, the present invention provides an incident laser beam profile which is sharpened or intensified at the reaction zone. The present invention is applicable to streams of reactant gases up to an inch in diameter using a single source of laser emission.

Thus, while preferred embodiments of the invention have been described, the present invention is capable of variation and modification and, therefore, the present invention should not be limited to the precise details set forth, but should include such changes and alterations as fall within the purview of the following claims.

What is claimed is:

1. A method for pyrolyzing gaseous materials with a laser heat source comprising:
   (a) directing a beam of laser emissions onto dispersing means which disperses and directs said emissions onto a reflective wall having a substantially ellipsoidal shaped defining two focal lines, said dispersing means positioned at one of said focal lines, said laser emissions being relected to said opposite focal line creating an area of intense laser emission; and
   (b) introducing gaseous material axially into the area of intense laser emission about said opposite focal lines by means of a reactant conduit axially aligned with the second focal line.

2. The method of claim 1 wherein said dispersing means is a conical member.

3. The method of claim 1 further comprising the step of removing heated materials from the housing.

4. The method of claim 1 wherein said intense laser emission produces a powdery reaction product.

5. The method of claim 4 wherein said reaction product is removed from the area of intense laser emission by means of an exit flue positioned axially along the focal line to receive the reaction product.

* * * * *

UNITED STATES PATENT OFFICE
CERTIFICATE OF CORRECTION

Patent No. 4,672,169  Dated  June 9, 1987

Inventor(s)  Frank A. Chambers

It is certified that error appears in the above-identified patent and that said Letters Patent are hereby corrected as shown below:

PATENT

| Column | Line | |
|---|---|---|
| 5 | 31 | "8" should read ---$\theta$---. |
| 8 | 20 | "shaped" should read ---shape---. |

Signed and Sealed this

Twenty-second Day of September, 1987

Attest:

DONALD J. QUIGG

Attesting Officer      Commissioner of Patents and Trademarks